(12) United States Patent
Chang

(10) Patent No.: US 7,064,021 B2
(45) Date of Patent: Jun. 20, 2006

(54) METHOD FOR FOMRING A SELF-ALIGNED LTPS TFT

(75) Inventor: Chih-Chin Chang, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 66 days.

(21) Appl. No.: 10/904,516

(22) Filed: Nov. 15, 2004

(65) Prior Publication Data

US 2005/0090045 A1    Apr. 28, 2005

Related U.S. Application Data

(62) Division of application No. 10/604,225, filed on Jul. 2, 2003, now Pat. No. 6,846,707.

(51) Int. Cl.
*H01L 21/84* (2006.01)
*H01L 21/00* (2006.01)

(52) U.S. Cl. .............................. 438/154; 257/E21.412; 257/E21.435; 257/E21.632; 257/E21.704

(58) Field of Classification Search ................. 438/153
See application file for complete search history.

(56) References Cited

U.S. PATENT DOCUMENTS

| 5,604,139 | A  | * | 2/1997 | Codama et al. ............. 438/151 |
| 6,197,626 | B1 | * | 3/2001 | Yamazaki et al. .......... 438/159 |
| 6,225,150 | B1 | * | 5/2001 | Lee et al. .................... 438/153 |
| 6,541,793 | B1 | * | 4/2003 | Ohnuma et al. ............... 257/57 |
| 2005/0250264 | A1 | * | 11/2005 | Hotta et al. ................. 438/154 |

* cited by examiner

*Primary Examiner*—Asok Kumar Sarkar
(74) *Attorney, Agent, or Firm*—Winston Hsu

(57) ABSTRACT

A method for forming a self-aligned low temperature polysilicon thin film transistor (LTPS TFT). First, active layers of a N type LTPS TFT (NLTPS TFT) and a P type LTPS TFT (PLTPS TFT) are formed on a substrate, and a gate insulating (GI) layer is formed on the substrate. Then, a source electrode, a drain electrode, and lightly doped drains (LDD) of the NLTPS TFT are formed. Further, gate electrodes of the NLTPS TFT and the PLTPS TFT are formed on the gate insulating layer. Finally, the gate electrode of the PLTPS TFT is utilized to form a source electrode and a drain electrode in the active layer of the PLTPS TFT.

15 Claims, 21 Drawing Sheets

METHOD FOR FOMRING A SELF-ALIGNED LTPS TFT

CROSS REFERENCE TO RELATED APPLICATIONS

This application is a division of application Ser. No. 10/604,225 filed on Jul. 2, 2003, now U.S. Pat. No. 6,846,707.

BACKGROUND OF THE INVENTION

1. Field of the Invention

The present invention relates to a method for forming a low temperature polysilicon thin film transistor (LTPS TFT), and more particularly, to a method for forming a self-aligned LTPS TFT.

2. Description of the Prior Art

A liquid crystal display is broadly applied to portable electronic apparatuses, such as notebooks and personal digital assistants (PDAs), because of its thin display panel, low power consumption, and low-radiation. As the requirements of high quality displays increase, flat panels with high quality and low price are demanding in the future. An LTPS TFT, which is an actively driving TFT, is one of the important technologies for achieving the goal.

An LTPS TFT-LCD includes at least a transparent substrate, a pixel array region, a scan line driving circuit region, and a data line driving circuit region. The pixel array region comprises a plurality of parallel scan lines, a plurality of parallel data lines, and a liquid crystal molecule layer. Each scan line and each data line define a pixel, and each pixel further comprises a TFT and a storage capacitor. Current LTPS TFT-LCD integrates a standard driving IC in a liquid crystal panel by utilizing LTPS CMOS TFT technologies, thus the size of displays and the cost are reduced.

As shown in FIGS. 1–5, the schematic diagrams demonstrate a method for forming a top gate LPTS CMOS TFT 38 according to the prior art. As shown in FIG. 1, the LTPS CMOS TFT 38 of the prior art comprises an N type low temperature polysilicon thin film transistor (NLTPS TFT) 34 and a P type low temperature polysilicon thin film transistor (PLTPS TFT) 36. The LTPS CMOS TFT 38 of the prior art is formed on a glass substrate 10, and the glass substrate 10 surface comprises a first region I for forming the NLTPS TFT 34, and a second region II for forming the PLTPS TFT 36. In addition, the glass substrate 10 surface further comprises a pixel array region (not shown in FIG. 1) for forming a plurality of NLTPS TFTs 34, which are used to be switches of pixel cells of an LCD, arranged in an array.

According to the prior art, an amorphous silicon (α-Si) layer (not shown in FIG. 1) is formed on the substrate 10, and an annealing process is performed such that the amorphous silicon layer will be recrystallized to a polysilicon layer (not shown in FIG. 1). Then, a first photo-etching process (PEP) is performed to form a patterned polysilicon layer 12 in both the first region I and the second region II of the substrate 10. Afterward, a low temperature deposition process is performed to form a gate insulating (GI) layer 14 to cover the patterned polysilicon layer 12 on the substrate 10, and an aluminum layer (not shown in FIG. 1) is formed over the gate insulating layer 14. Finally, a second photo-etching process is performed to respectively form a gate electrode 16 of the NLTPS TFT 34 and the PLTPS TFT 36 in the aluminum layer of the first region I and the second region II.

As shown in FIG. 2, an implantation process 18 is performed by utilizing the gate electrodes 16 as a mask to implant phosphorous ions into the patterned polysilicon layer 12, which is not covered by the gate electrode 16, to form a plurality of N type lightly doped areas 20. As shown in FIG. 3, a photo resist layer (not shown in FIG. 3) is formed on the substrate 10, and a third photo-etching process is performed to form a patterned photo resist layer 22 in the photo resist layer to cover the second region 11 and the gate electrode 16 of the first region I. Then, an implantation process 24 is performed to implant arsenic ions into the patterned polysilicon layer 12, which is not covered by the patterned photo resist layer 22, to form two N type heavily doped areas 26s and 26d. The N type heavily doped areas 26s and 26d are for respectively being a source electrode and a drain electrode of the NLTPS TFT 34, the lightly doped areas 20, which are located on the side of the N type heavily doped areas 26s and 26d, are used to be lightly doped drains (LDD) of the NLTPS TFT 34, and the patterned undoped polysilicon layer 12, which is below the gate electrode 16 of the NLTPS TFT 34, is for being a channel area of the NLTPS TFT 34.

As shown in FIG. 4, the remaining patterned photo resist layer 22 is removed, and another photo resist layer (not shown in FIG. 4) is formed on the substrate 10. Then, a fourth photo-etching process is performed to form a patterned photo resist layer 28 in the photo resist layer. Afterward, an implantation process 30 is performed by utilizing the patterned photo resist layer 28 and the gate electrode 16 of the PLTPS TFT 36 as a mask to implant boron ions into the patterned polysilicon layer 12, which is not covered by the photo resist layer 28 and the gate electrode 16, such that two P type heavily doped areas 32s and 32d for respectively being a source electrode and a drain electrode of the PLTPS TFT 36 are formed. The patterned undoped polysilicon layer 12, which is below the gate electrode 16, is used to be a channel area of the PLTPS TFT 36. Finally, as shown in FIG. 5, the remaining patterned photo resist layer 28 is removed to form the NLTPS TFT 34 and the PLTPS TFT 36 of the LTPS CMOS TFT 38 of the prior art.

According to the method for forming the LTPS CMOS TFT 38 of the prior art, the gate electrodes 16 of the NLTPS TFT 34 and the PLTPS TFT 36 are first formed, than the N type lightly doped drains 20, the N type source electrode and drain electrode, and the P type source electrode and drain electrode are respectively formed.

Although the above-mentioned method utilizes the gate electrodes 16 as a self-aligned mask to form the N type lightly doped areas 20, another photo resist mask is still required when forming the source electrode and the drain electrode of the NLTPS TFT 34. However, when defining the pattern of the photo resist mask in a photo process by a stepper or a scanner, misalignment or overlap could occur because of human or non-human factors. For example, as shown in FIG. 3, the patterned photo resist layer 22 may shift left, and parts of the patterned polysilicon layer 25 will not be doped. Thus the lightly doped areas 20 will not be equally doped. The asymmetric lightly doped areas 20 not only are incapable of restraining the hot electron effect, but may also generate leakage current of the gate electrode, and further result in breakdown.

Therefore, to form a lightly doped drain with uniform width and avoid a too narrow range between the source electrode and the drain electrode resulting from the misalignment in the photo process is an important topic for study during the LTPS TFT manufacturing processes.

SUMMARY OF INVENTION

It is therefore one object of the present invention to provide a method for forming an LTPS TFT that can self align the lightly doped drains, the source electrode, and the drain electrode, such that the error resulting from the photo process can be avoided.

It is another object of the present invention to provide a method for forming an LTPS CMOS TFT in a self-aligned manner to obtain symmetric lightly doped drains without superfluous processes.

According to the present invention, a method for forming an LTPS TFT on a substrate in a dual self-aligned manner is provided. The substrate surface comprises at least a first region for forming at least an NLTPS TFT, and at least a second region for forming at least a PLTPS TFT. First, a patterned undoped polysilicon layer is formed on each of the first and second regions of the substrate, and each patterned undoped polysilicon layer comprises a source area, a drain area, and a channel area. Then a dielectric layer and a patterned conductive layer are formed on the substrate to cover the patterned undoped polysilicon layer. The patterned conductive layer of the first region comprises two first gaps. Afterward, a first implantation process is performed to implant N type dopants into the source area and the drain area in the patterned undoped polysilicon layer by the first gaps in a self-aligned manner, such that an N type source electrode and an N type drain electrode are respectively formed. Thereafter, a certain width of the patterned conductive layer is removed to form two second gaps in the patterned conductive layer, and simultaneously a gate electrode of the N type LTPS TFT is defined. Subsequently, a second implantation process is performed to implant N type dopants into the patterned undoped polysilicon layer of the first region by the two second gaps in a self-aligned manner, such that two N type lightly doped drains (LDD) are formed. After, a gate electrode of the P type LTPS TFT is formed in the patterned conductive layer of the second region. Finally, a P type source electrode and a P type drain electrode of the P type LTPS TFT are formed in the source area and the drain area of the second region.

The present invention first utilizes the patterned conductive layer as a self-aligned mask to form the N type source and the N type drain, then utilizes the reduced patterned conductive layer as a self-aligned mask to form the N type lightly doped drain and the gate electrode, and finally utilizes the gate electrode as a self-aligned mask to form the P type source and the P type drain. The present invention utilizes multiple self-aligned processes to form the LTPS TFT, which does not increases superfluous processes and excessive costs, but obtains symmetric N type lightly doped drains. Furthermore, the misalignment problem due to multiple photo-etching processes can be avoided.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a method for simultaneously forming an NLTPS TFT and a PLTPS TFT. However, the application of the present invention is not limited by the embodiments. In a preferred embodiment of the present invention, the method of the present invention can be also applied to form an LTPS CMOS TFT composed of an NLTPS TFT and a PLTPS TFT. The LTPS CMOS TFT, NLTPS TFT, or PLTPS TFT of the present invention is formed in a periphery circuit area of an LCD for being a logic device. Moreover, the NLTPS TFT used to be a switching device could also be formed by the method of the present invention in a pixel array area of the LCD.

Figure 1:
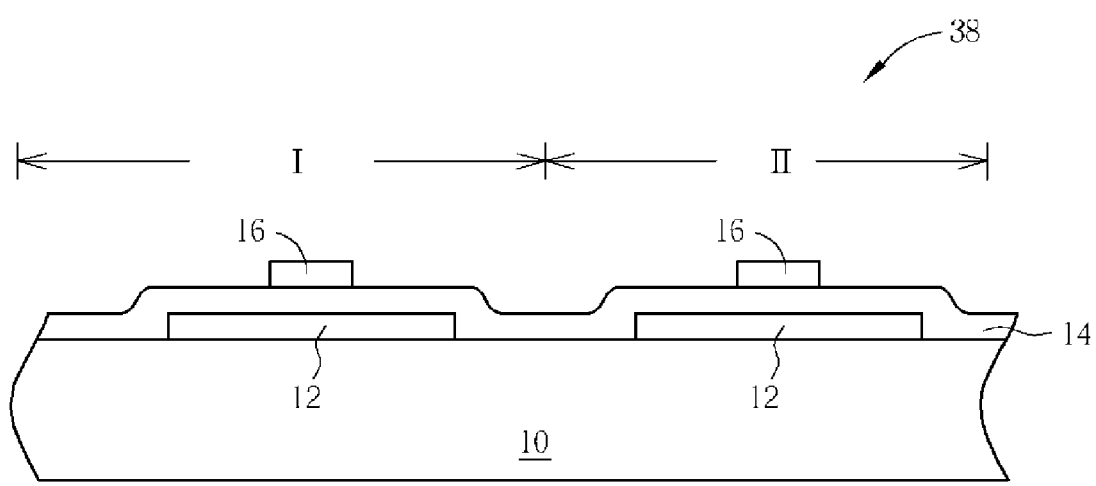
FIGS. 1–5 are schematic diagrams of a method of forming an LTPS CMOS TFT according to the prior art.
Figure 2:
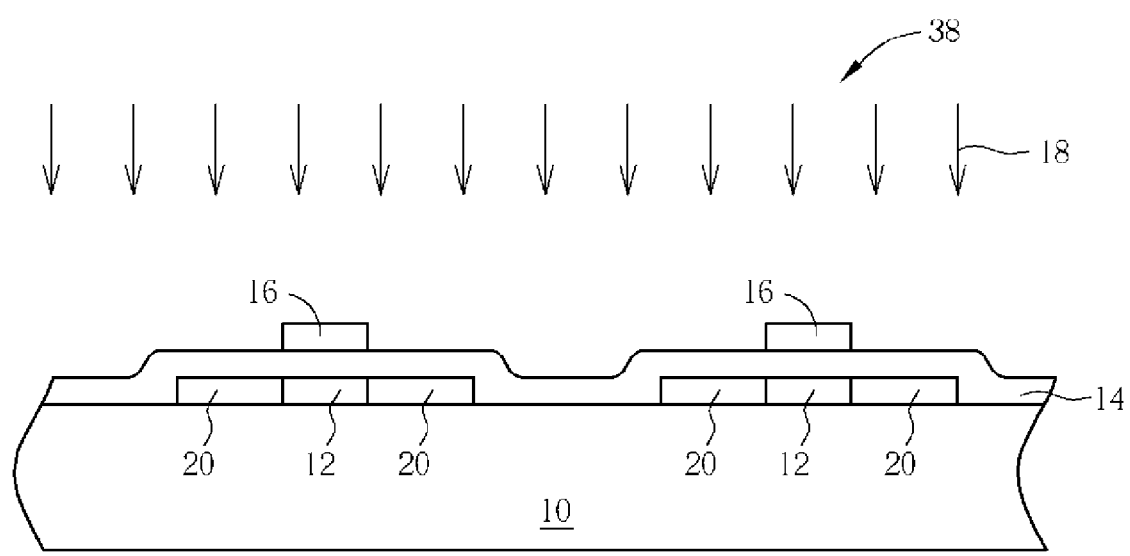
Figure 3:
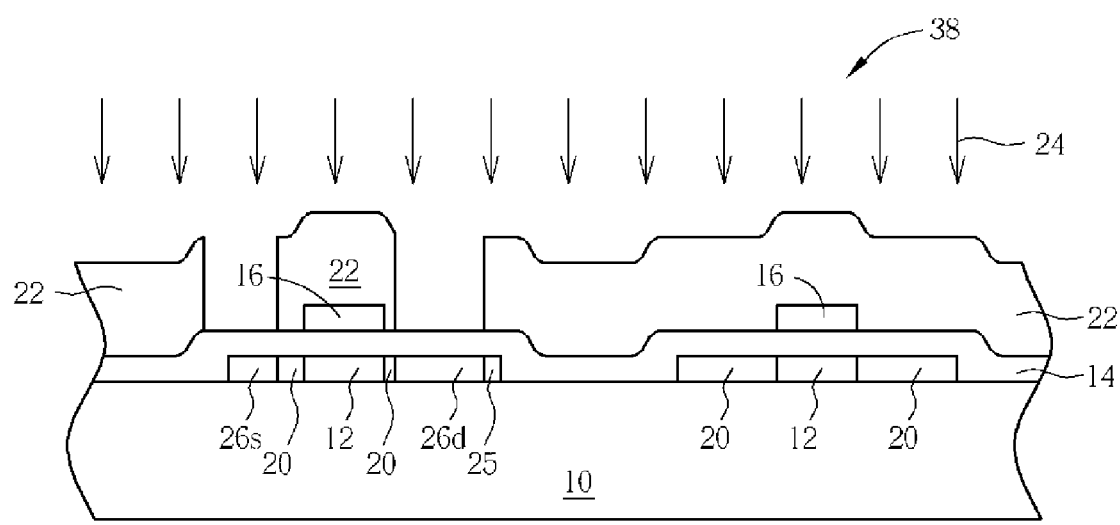
Figure 4:
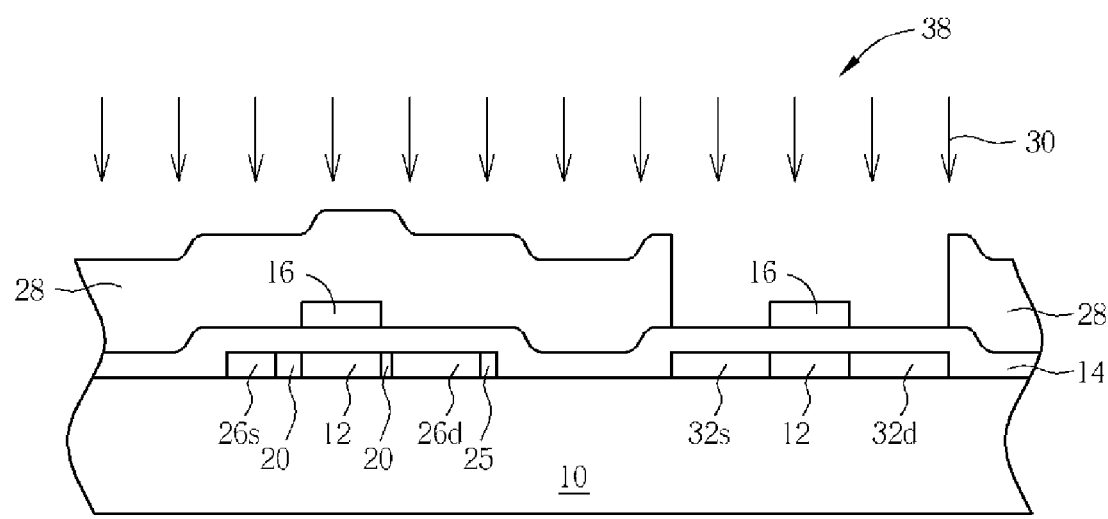
Figure 5:
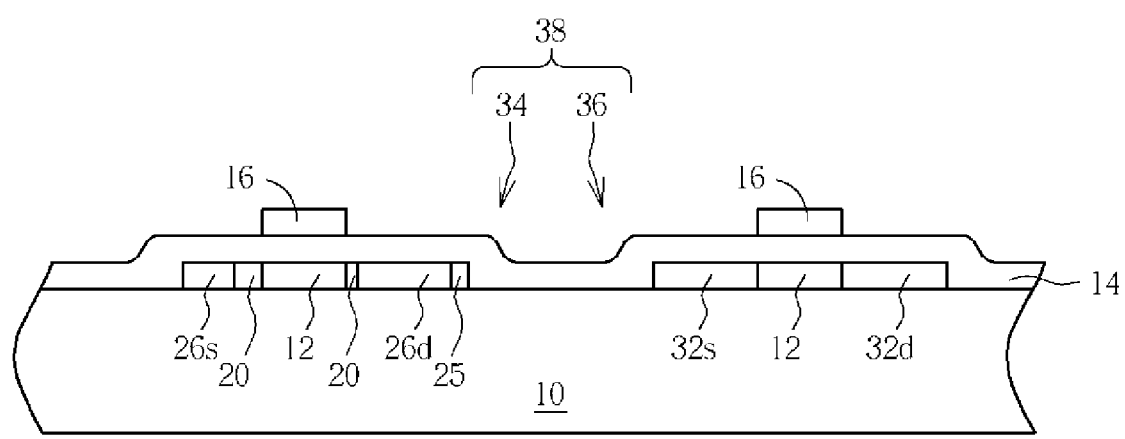
Figure 6:
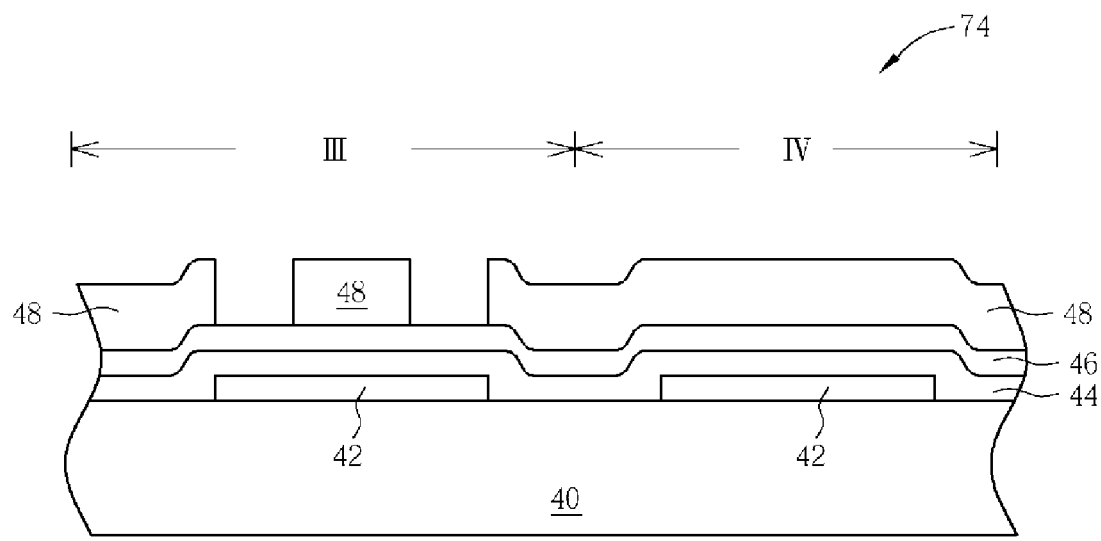
FIGS. 6–14 are schematic diagrams of a method for forming an LTPS CMOS TFT according to a preferred embodiment of the present invention.

An example of forming an LTPS CMOS TFT 74 is used here for illustrating the method of the present invention. FIGS. 6–14 are schematic diagrams of a method for forming the LTPS CMOS TFT 74 according to a preferred embodiment of the present invention. As shown in FIG. 6, the LTPS CMOS TFT 74 is formed on a substrate 40, and the substrate 40 surface comprises an NLTPS TFT region III for forming an NLTPS TFT 70 and a PLTPS TFT region IV for forming a PLTPS TFT 72. The substrate 40 is a transparent insulating substrate, such as a glass substrate or a quartz substrate.

First, a sputtering process is performed to form an amorphous silicon layer (not shown in FIG. 6 and FIG. 7), having thickness between 400 to 600 Å, on the substrate 40. Then, an annealing process, such as an excimer laser annealing (ELA) process, is performed to recrystallize the amorphous silicon layer to a polysilicon layer (not shown in FIG. 6). Afterward, a first photo-etching process is performed to form a patterned polysilicon layer 42 in both the NLTPS TFT region III and the PLTPS TFT region IV of the substrate 40. Each patterned polysilicon layer 42 comprises a source area, a drain area, and a channel area (all not shown in FIG. 6). It is noted that the annealing process can be alternatively performed after the first photo-etching process. Additionally, a buffer layer (not shown in FIG. 6) can be further formed between the substrate 40 and the amorphous silicon layer to prevent the substrate 40 from being damaged during the annealing process or the photo-etching process.

Figure 7:
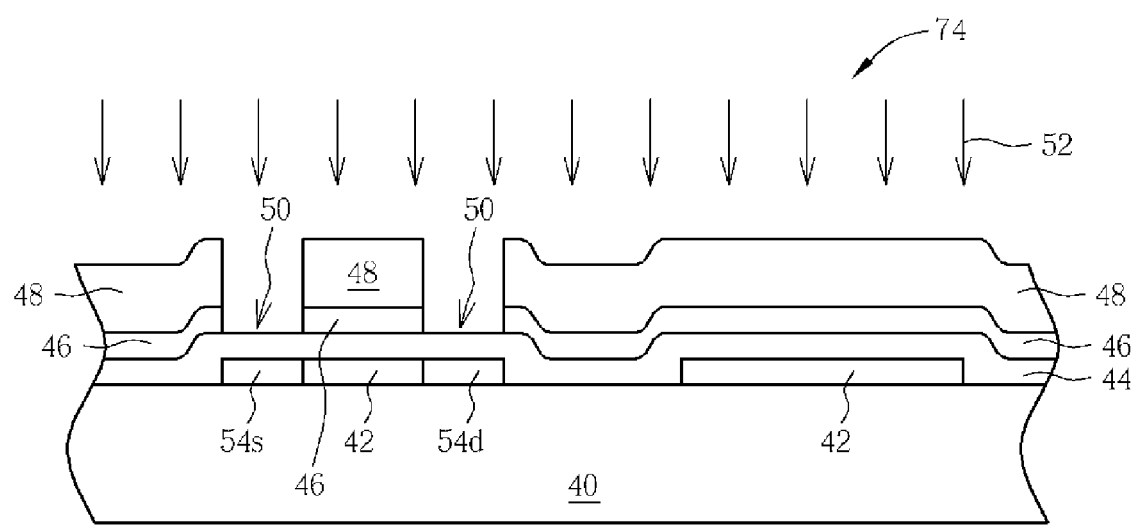

Following that, a low temperature deposition process is performed to form a silicon oxide layer or a silicon nitride layer, having thickness between 600 to 800 Å, to cover the patterned polysilicon layer 42 on the substrate 40 as a gate insulating layer 44. Then a conductive layer 46 and a photo resist layer (not shown in FIG. 6) are formed on the gate insulating layer 44. After, a second photo-etching process is performed. During the second photo-etching process, first a patterned photo resist layer 48 is formed, and then the conductive layer 46, which is not covered by the patterned photo resist layer 48, is removed to form two gaps 50 in the conductive layer 46 as shown in FIG. 7. Thereafter, an implantation process 52 is performed to implant N type dopants into the source area and the drain area in the patterned polysilicon layer 42 by the gaps 50 in a self-aligned manner, such that a source electrode 54s and a drain electrode 54d of the NLTPS TFT 70 are formed. It is noted that, the material of the conductive layer comprises aluminum, wolfram, chromium, or molybdenum, the dopant concentration in the implantation process is about 1E14 to 1E16 atoms/cm$^2$, and the N type dopants comprise arsenic or phosphorous.

Figure 8:
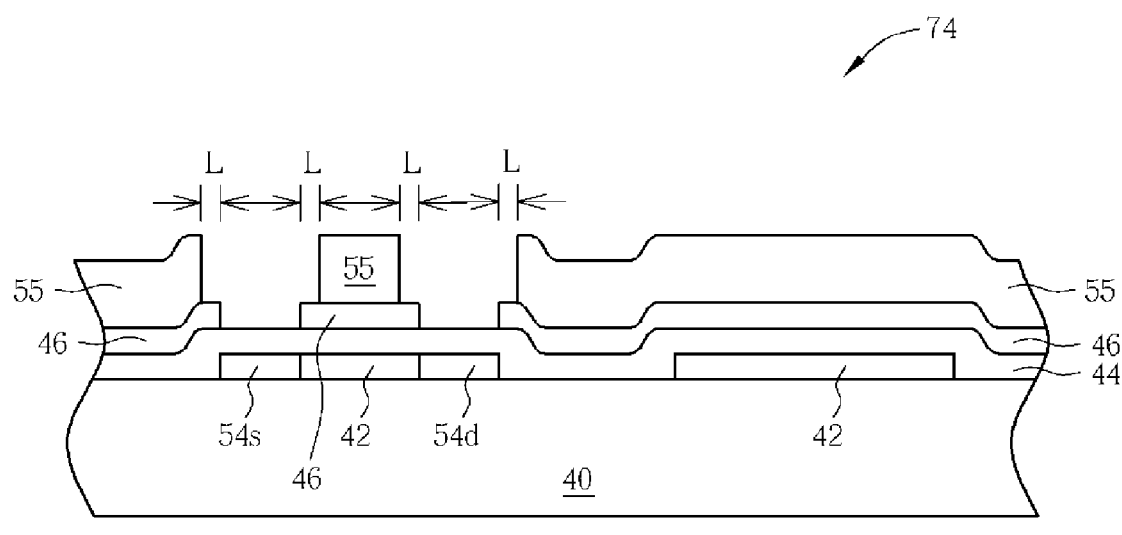
Figure 9:
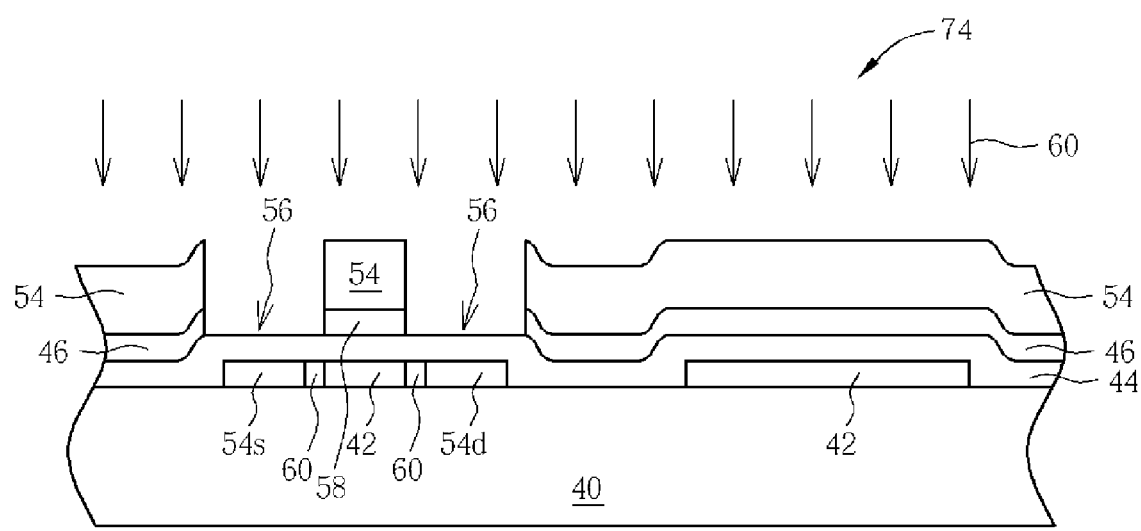

As shown in FIG. 8 and FIG. 9, a trimming process is performed to reduce a certain width L of the patterned photo resist layer 48. Then an etching process is performed to remove the conductive layer 46 that is not covered by the reduced patterned photo resist layer 55, such that the width of the two gaps 50 will be enlarged to two larger gaps 56, and meanwhile a gate electrode 58 of the NLTPS TFT 70 is defined. After, an implantation process 60 is performed to implant N type dopants into the patterned polysilicon layer 42 by the two gaps 56 in a self-aligned manner, such that two N type lightly doped drains 60 are formed. The trimming process includes an ash process, a descum process, and an ultraviolet beaming process or a thermal curing process. The dopant concentration in the implantation process is preferably about 1E12 to 1E14 atoms/cm$^2$, and the N type dopants comprise arsenic or phosphorous.

Figure 10:
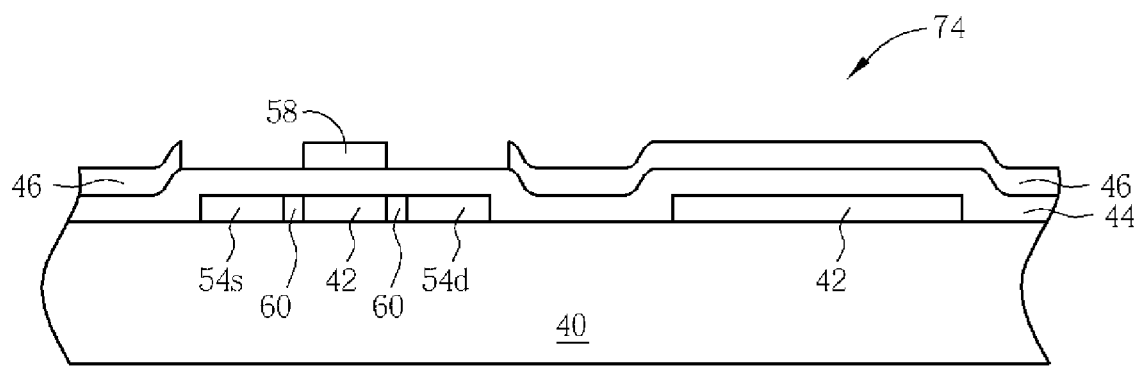
Figure 11:
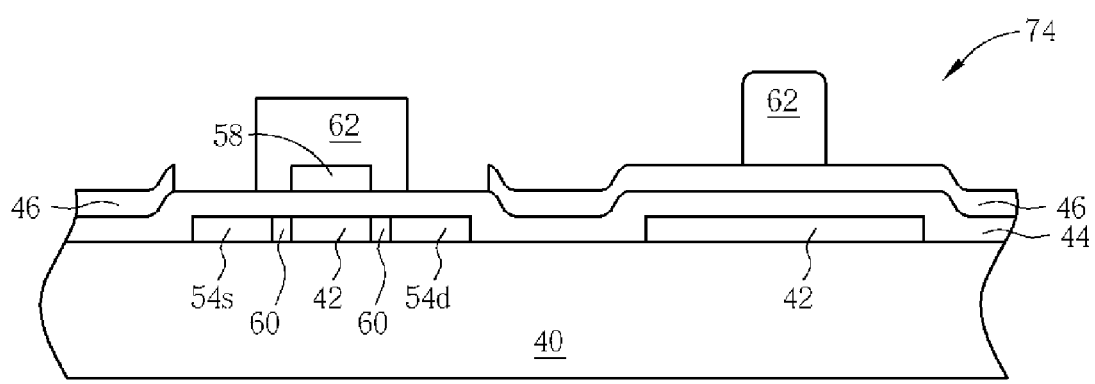
Figure 12:
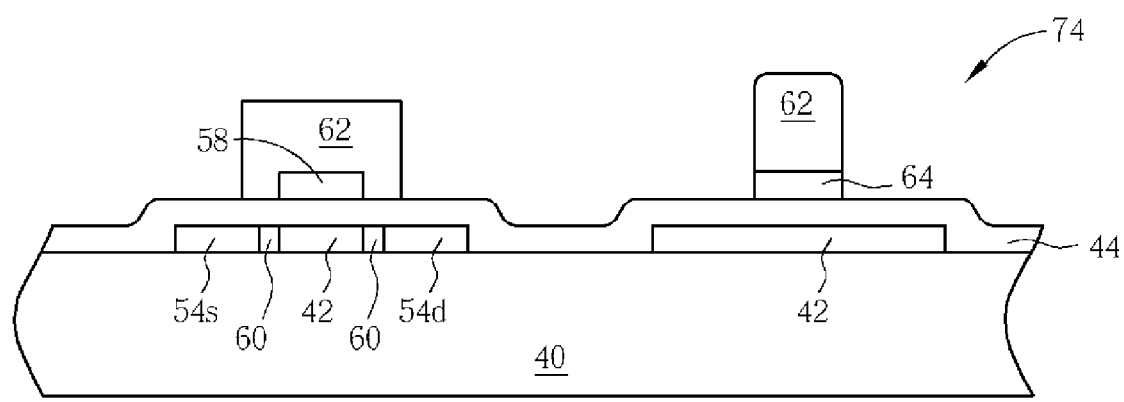

As shown in FIGS. 10–12, a photo resist layer (not shown) is formed on the substrate 40 after removing the reduced patterned photo resist layer 54. Then, a third photo-etching process is performed. During the third photo-etching process, a patterned photo resist layer 62 is first formed to cover the gate electrode 58 of the NLTPS TFT 70 and the channel area of the PLTPS TFT region IV, then the conductive layer 46, which is not covered by the patterned photo resist layer 62, is removed to form a gate electrode 64 of the PLTPS TFT 72. The patterned photo resist layer 62 is used to define the gate electrode 64 of the PLTPS TFT 72 and to protect the gate electrode 58 of the NLTPS TFT 70, and the patterned photo resist only needs to cover the gate electrode 64 of the PLTPS TFT 72. Since the gate electrode 64 is well protected, a tiny alignment error is tolerable during the photo process.

Figure 13:
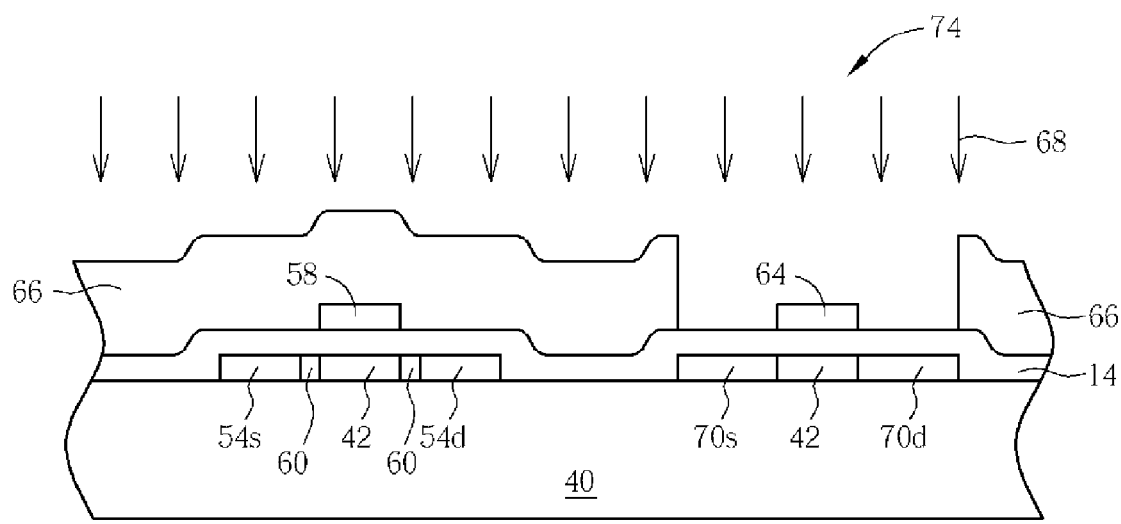
Figure 14:
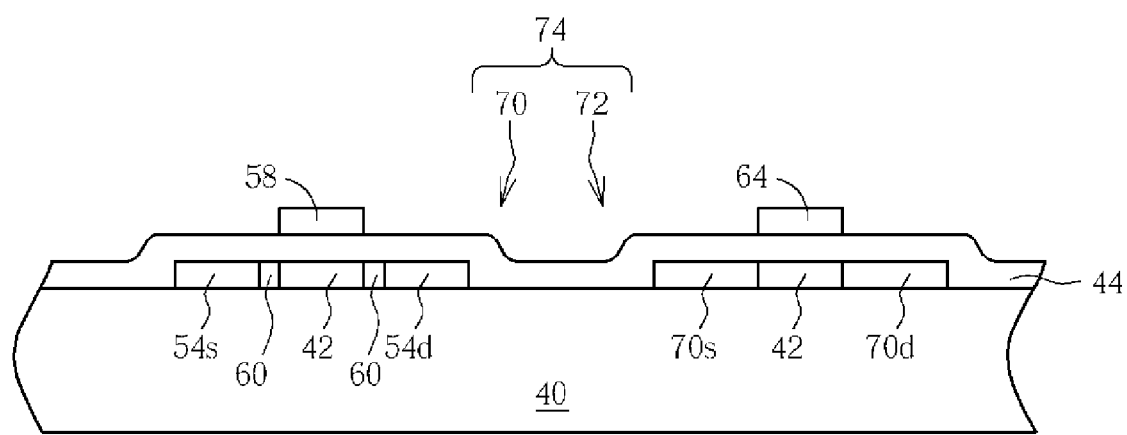

As shown in FIG. 13 and FIG. 14, a photo resist layer (not shown) is formed on the substrate 40 after removing the remaining patterned photo resist layer 62. Then a fourth photo-etching process is performed to form a patterned photo resist layer 66 in the photo resist layer. After, an implantation process 68 is performed to implant P type dopants into the source area and the drain area in the patterned polysilicon layer 42, which are not covered by the patterned photo resist layer 62 and the gate electrode 64, to form a source electrode 70s and a drain electrode 70d of the PLTPS TFT 72. Finally, the patterned photo resist layer 66 is removed to form the NLTPS TFT 70 and the PLTPS TFT 72 of the present invention. It is noted that the dopant concentration in the implantation process is preferably about 1E14 to 1E16 atoms/cm$^2$, and the P type dopants comprise boron or boron fluoride ($BF_2$).

Figure 15:
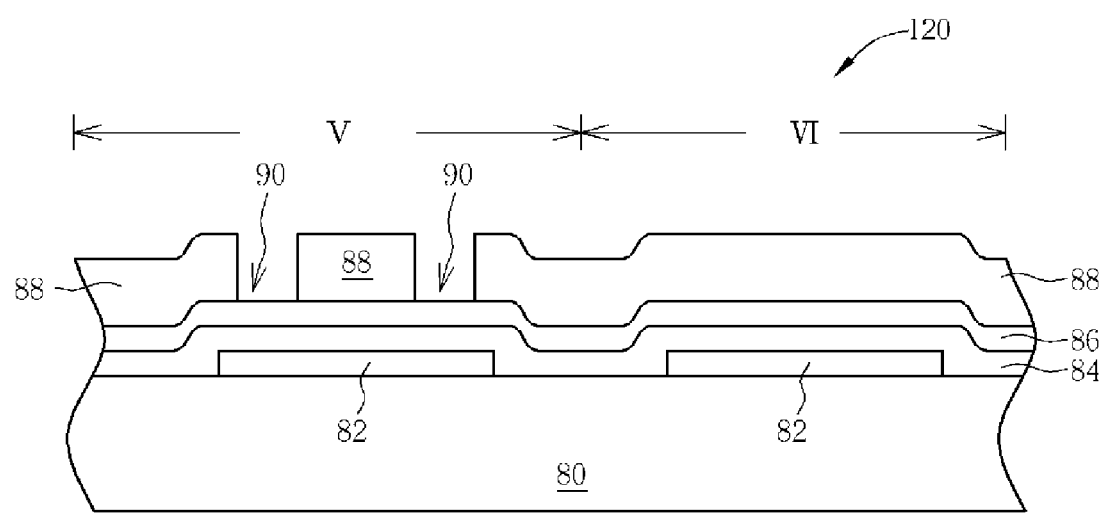
FIGS. 15–21 are schematic diagrams of a method for forming an LTPS CMOS TFT according to a second embodiment of the present invention.

FIGS. 15–21 are schematic diagrams of a method for forming an LTPS CMOS TFT 120 according to a second embodiment of the present invention. As shown in FIG. 15, the LTPS CMOS TFT 120 is formed on a substrate 80, and the substrate 80 surface comprises an NLTPS TFT region V for forming an NLTPS TFT 114 and a PLTPS TFT region VI for forming a PLTPS TFT 116. First, a polysilicon layer (not shown in FIG. 15) is formed on the substrate 80, then a first photo-etching process is performed to form a patterned polysilicon layer 82 in both the NLTPS TFT region V and the PLTPS TFT region VI, and a gate insulating layer 84, a conductive layer 86, and a photo resist layer 88 are sequentially formed on the substrate 80.

Figure 16:
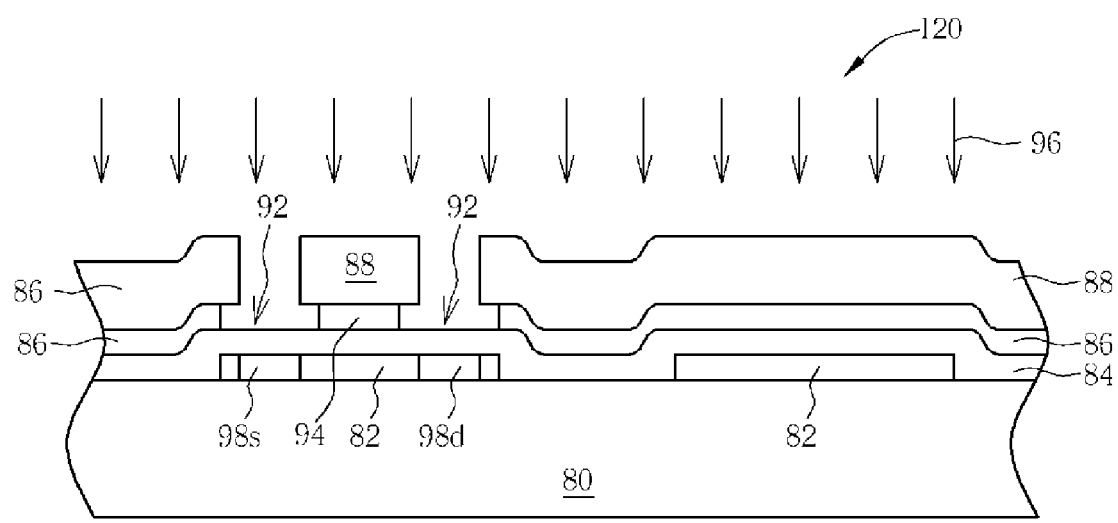
Figure 17:
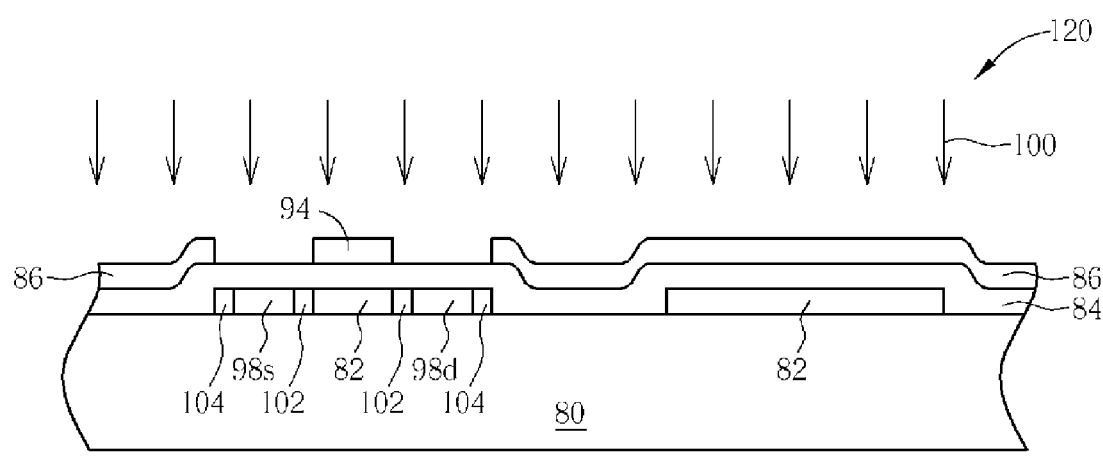

As shown in FIG. 16 and FIG. 17, a second photo-etching process is performed to form two gaps 90 in the photo resist layer 88, and an isotropic etching process, such as a wet etching process, is performed to remove the conductive layer 86 that is not covered by the photo resist layer 88, such that two gaps 92 are formed in the conductive layer 86 (the width of the gaps 92 is larger than that of the gaps 90), and a gate electrode 94 of the NLTPS TFT 114 is simultaneously defined. Then, an N type implantation process 96 is performed by utilizing the photo resist layer 88 as a mask to form two N type heavily doped areas 98s and 98d in the patterned polysilicon layer 82. After, the photo resist layer 88 is removed, and an N type implantation 100 is performed by utilizing the gate electrode 94 and the conductive layer 86 as a mask to form a plurality of N type lightly doped areas 102 and 104 in the patterned polysilicon layer 82 of the NLTPS TFT region V. The N type heavily doped areas 98s and 98d are respectively used to be a source electrode and a drain electrode of the NLTPS TFT 114, the N type lightly doped areas 102 are used to be lightly doped drains of the NLTPS TFT 114, and the patterned undoped polysilicon layer 82 below the gate electrode 94 of the NLTPS TFT 114 is used to be a channel area of the NLTPS TFT 114.

Figure 18:
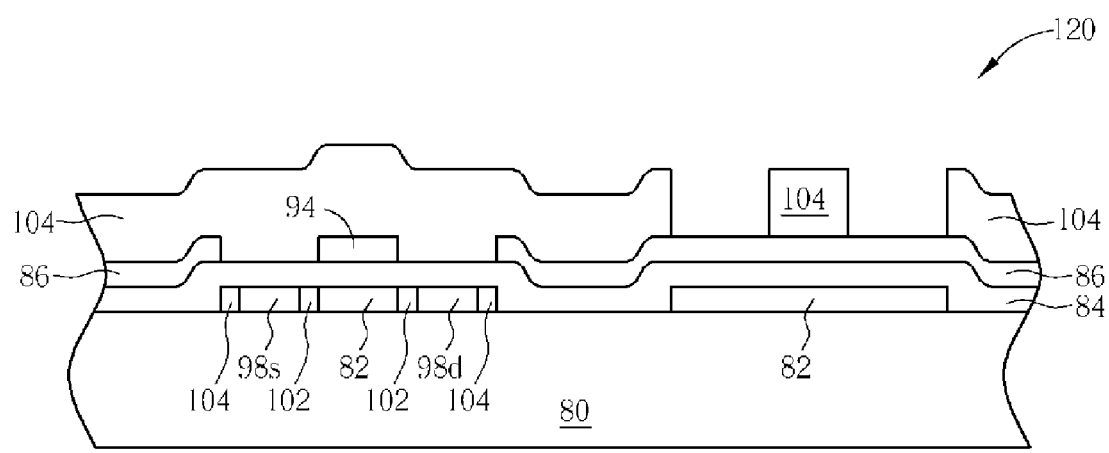
Figure 19:
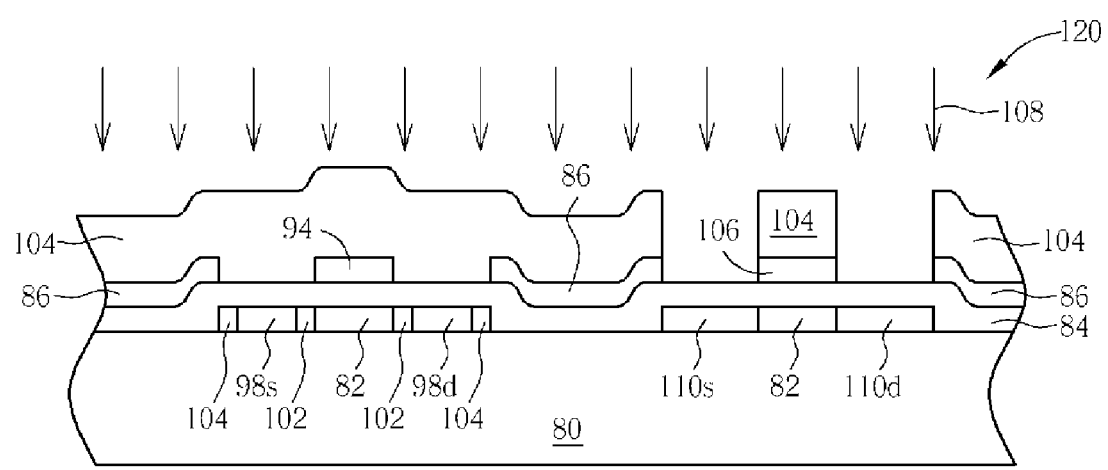

As shown in FIG. 18 and FIG. 19, a photo resist layer (not shown in FIG. 18) is formed on the substrate 80, and a third photo-etching process is performed to form a patterned photo resist layer 104 in the photo resist layer. Then, the conductive layer 86, which is not covered by the patterned photo resist layer 104, is removed to form a gate electrode 106 of the PLTPS TFT 116. Afterward, an implantation process 108 is performed by utilizing the patterned photo resist layer 104 as a mask to respectively form two P type heavily doped areas 110s and 110d in the source area and the drain area of the PLTPS TFT region VI for respectively being a source electrode and a drain electrode of the PLTPS TFT 116.

Figure 20:
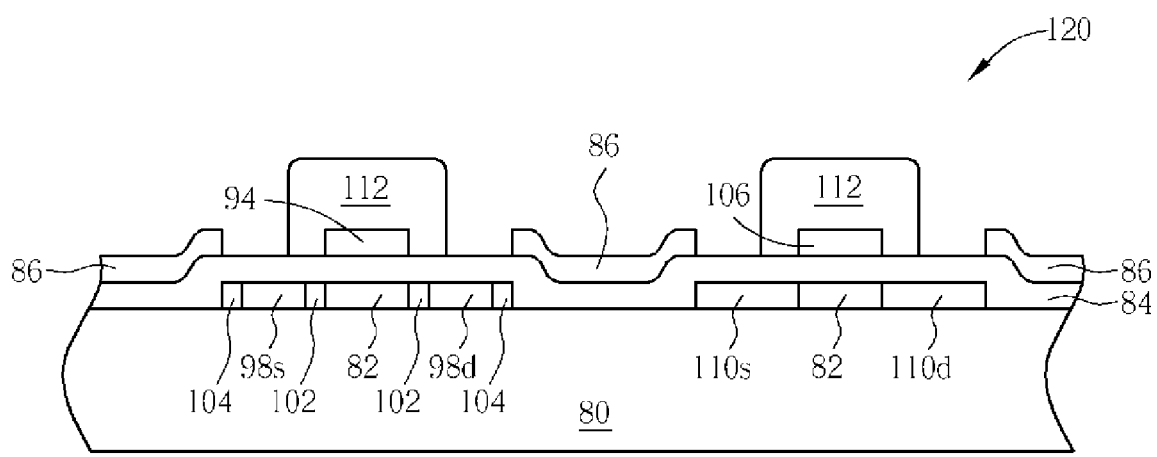
Figure 21:
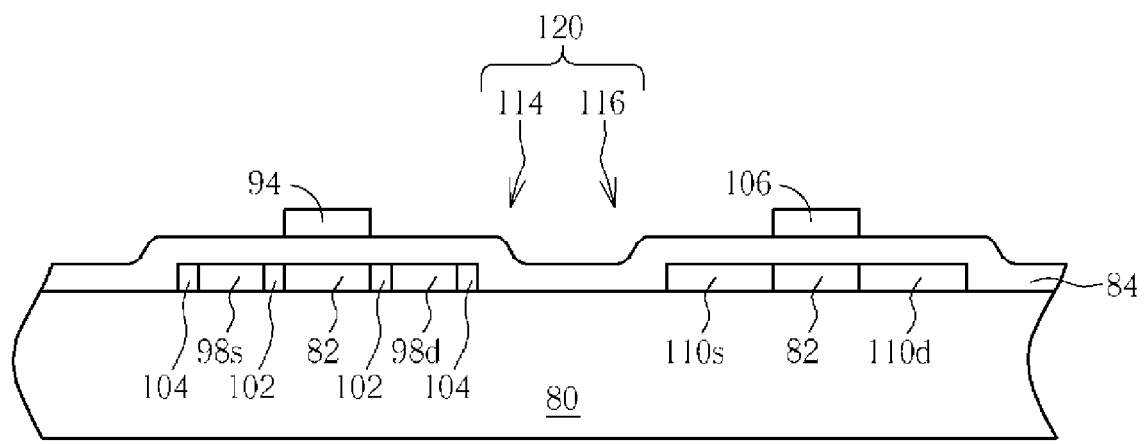

As shown in FIGS. 20 and 21, a fourth photo-etching process is performed after removing the remaining patterned photo resist layer 104. During the fourth photo-etching process, a patterned photo resist layer 112 is first formed on the substrate 80 to cover the gate electrode 104 and the gate electrode 106 of the PLTPS TFT 116, and then the conductive layer 86, which is not covered by the patterned photo resist layer 112, is removed. Finally, the patterned photo resist layer 112 is removed to form the NLTPS TFT 114 and the PLTPS TFT 116 of the LTPS CMOS TFT 120 of the present invention.

While it is one object of the present invention to form a top gate LTPS CMOS TFT, the application of the present invention is not limited by the embodiments. The present invention can also be applied to form scan lines, data lines, and storage capacitors of an LTPS TFT-LCD, and other low temperature polysilicon thin film transistors. Furthermore, an NLTPS TFT can be formed according to the method shown in FIGS. 6–10 in the preferred embodiment, while a PLTPS TFT can be alternatively formed according to the method shown in FIGS. 11–14 according to the second embodiment of the present invention, and vice versa.

According to the method for forming an LTPS CMOS TFT of the present invention, a patterned conductive is used as a self-aligned mask to form an N type source electrode and an N type drain electrode, the reduced patterned conductive layer is used as a self-aligned mask to form N type lightly doped drains, then a gate electrode is formed, and finally the gate electrode is used as a self-aligned mask to form a P type source electrode and a P type drain electrode. The present invention utilizes multiple self-aligned processes to form the LTPS CMOS TFT without increasing superfluous processes, which not only reduce the costs but also obtain symmetric N type lightly doped drains. Further the misalignment problem resulting from multiple photo-etching processes can be avoided.

In contrast to the prior art, though the present invention utilizes four photo-etching processes as the prior art does, the present invention utilizes multiple self-aligned processes to form the source electrode, the drain electrode, and the lightly doped drains. Therefore, the NLTPS TFT and the PLTPS TFT of the present invention are more reliable, and further the misalignment problem can be avoided. It is worth noticing that the method of the present invention can be not only applied to form the NLTPS TFT and the PLTPS TFT, but also applied to form LTPS CMOS TFT.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a self-aligned low temperature polysilicon thin film transistor (LTPS TFT), the method comprising the steps of:
    providing a substrate comprising an N type LTPS TFT region and a P type LTPS TFT region;
    sequentially forming a patterned undoped polysilicon layer, a dielectric layer, a conductive layer, and a first patterned photo resist layer, the first patterned photo resist layer comprising two first gaps;
    performing an isotropic etching process to remove parts of the conductive layer via the two first gaps to form two second gaps, and to form a gate of an N type LTPS TFT;
    implanting N type dopants into the patterned undoped polysilicon layer of the N type LTPS TFT region to form a source and a drain of the N type LTPS TFT;
    removing the first patterned photo resist layer;
    implanting N type dopants into the patterned undoped polysilicon layer of the N type LTPS TFT region to form two lightly doped drains (LDD) of the N type LTPS TFT;
    forming a gate of a P type LTPS TFT in the P type LTPS TFT region; and
    forming a source and a drain of the P type LTPS TFT in the P type LTPS TFT region.

2. The method of claim 1 wherein the substrate is a glass substrate of a quartz substrate.

3. The method of claim 1 wherein a buffer layer exists between the substrate and the patterned undoped polysilicon layer.

4. The method of claim 1 wherein the step of forming the patterned undoped polysilicon layer further comprises:
    performing a sputtering process to form an amorphous silicon ($\alpha$-Si) layer on the substrate;
    performing an annealing process, such that the amorphous silicon layer is recrystallized and turned a polysilicon layer; and
    performing a photo-etching process (PEP) to form a patterned undoped polysilicon layer in both the N type LTPS TFT region and the P type LTPS TFT region.

5. The method of claim 1 wherein the material of the dielectric layer comprises silicon oxide or silicon nitride.

6. The method of claim 1 wherein the width of each first gap of the first patterned photo resist layer is smaller than the width of each second gap.

7. The method of claim 1 wherein the material of the conductive layer is selected from the group consisting of aluminum, wolfram, chromium, and molybdenum.

8. The method of claim 1 wherein the N type dopants comprise arsenic or phosphorous.

9. The method of claim 1 wherein the P type dopants comprise boron or boron fluoride ($BF_2$).

10. The method of claim 1 wherein the step of forming the gate of the P type LTPS TFT further comprises:
    forming a first patterned photo resist layer to cover the gate of the N type LTPS TFT and parts of the P type LTPS TFT region for defining the gate of the P type LTPS TFT;
    removing the conductive layer that is not covered by the first patterned photo resist layer, such that the gate of the P type LTPS TFT is formed; and
    removing the first patterned photo resist layer.

11. The method of claim 1 wherein the step of forming the source and the drain further comprises:
    forming a second patterned photo resist layer on the substrate;
    implanting P dopants into the patterned undoped polysilicon layer of the P type LTPS TFT region by utilizing the second patterned photo resist layer and the gate of the P type LTPS TFT as a mask, such that the source and the drain of the P type LTPS TFT are formed; and
    removing the second patterned photo resist layer.

12. The method of claim 1 wherein the step of forming the gate, the source, and the drain of the P type LTPS TFT further comprises:
    forming a third patterned photo resist layer, the third photo resist layer exposing parts of the patterned undoped polysilicon layer of the P type LTPS TFT region;
    removing the patterned conductive layer that is not covered by the third patterned photo resist layer to form the gate of the P type LTPS TFT;
    implanting P dopants into the patterned undoped polysilicon layer of the P type LTPS TFT region by utilizing the gate of the P type LTPS TFT and the third patterned photo resist layer as a mask, such that the P type source and the drain of the P type LTPS TFT are formed;
    removing the third patterned photo resist layer;
    forming a fourth patterned photo resist layer to cover the gate of the N type LTPS TFT and the gate of the P type LTPS TFT;
    removing the patterned conductive layer that is not covered by the fourth patterned photo resist layer; and
    removing the fourth patterned photo resist layer.

13. The method of claim 1 wherein the N type LTPS TFT is installed in a pixel array area as a switching device of a pixel cell of an LCD.

14. The method of claim 13 wherein the P type LTPS TFT and the N type LTPS TFT are low temperature polysilicon complementary metal-oxide-semiconductor thin film transistors (LTPS CMOS TFTs), and are installed in a periphery circuit area of the LCD as a logic device of the periphery circuit of the LCD.

15. The method of claim 1 wherein the isotropic etching process is a wet etching process.

* * * * *

UNITED STATES PATENT AND TRADEMARK OFFICE
CERTIFICATE OF CORRECTION

| | | |
|---|---|---|
| PATENT NO. | : 7,064,021 B2 | Page 1 of 1 |
| APPLICATION NO. | : 10/904516 | |
| DATED | : September 7, 2006 | |
| INVENTOR(S) | : Chih-Chin Chang | |

It is certified that error appears in the above-identified patent and that said Letters Patent is hereby corrected as shown below:

On the title page, item [54] should read --Method for forming a self-Aligned LTPS TFT--.

Column 1, line 1 "fomring" should read --forming--.

Signed and Sealed this

Seventeenth Day of October, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,064,021 B2 | Page 1 of 1 |
| APPLICATION NO. | : 10/904516 | |
| DATED | : June 20, 2006 | |
| INVENTOR(S) | : Chih-Chin Chang | |

It is certified that error appears in the above-identified patent and that said Letters Patent is hereby corrected as shown below:

On the title page, item [54] should read--Method for forming a self-Aligned LTPS TFT--.

Column 1, line 1 "fomring" should read--forming--.

This certificate supersedes Certificate of Correction issued October 17, 2006.

Signed and Sealed this

Twenty-first Day of November, 2006

JON W. DUDAS
*Director of the United States Patent and Trademark Office*